United States Patent
Kando (10) Patent No.: US 6,960,866 B2
(45) Date of Patent: Nov. 1, 2005

(54) SURFACE ACOUSTIC WAVE DEVICE

(75) Inventor: Hajime Kando, Nagaokakyo (JP)

(73) Assignee: Murata Manufacturing Co., Ltd., Kyoto (JP)

(*) Notice: Subject to any disclaimer, the term of this patent is extended or adjusted under 35 U.S.C. 154(b) by 0 days.

(21) Appl. No.: 10/993,298

(22) Filed: Nov. 18, 2004

(65) Prior Publication Data

US 2005/0088058 A1 Apr. 28, 2005

Related U.S. Application Data

(62) Division of application No. 09/887,173, filed on Jun. 22, 2001, now Pat. No. 6,841,918.

(30) Foreign Application Priority Data

| Jul. 26, 2000 | (JP) | ............... | 2000-226073 |
| Aug. 10, 2000 | (JP) | ............... | 2000-242884 |

(51) Int. Cl.[7] .............................................. H03H 9/25
(52) U.S. Cl. .............................. 310/313 C; 310/313 B; 310/313 D; 310/313 R
(58) Field of Search .................... 310/313 B–313 D, 310/313 R (56) References Cited

U.S. PATENT DOCUMENTS

| 4,162,465 A |   | 7/1979  | Hunsinger |           |
|-------------|---|---------|-----------|-----------|
| 4,910,839 A |   | 3/1990  | Wright    |           |
| 5,061,871 A | * | 10/1991 | Wright    | 310/313 B |

(Continued)

FOREIGN PATENT DOCUMENTS

| EP | 1 143 612 A1 | 10/2001 |   |           |
|----|--------------|---------|---|-----------|
| JP | 56-010724    | 2/1981  |   |           |
| JP | 58-084517    | 5/1983  |   |           |
| JP | 61-006917    | 1/1986  |   |           |
| JP | 61-144909    | 7/1986  |   |           |
| JP | 3-132208     | * 5/1991 |  | H03H/9/145 |
| JP | 08-288780    | 11/1996 |   |           |
| JP | 11-330895    | 11/1999 |   |           |
| JP | 2000-091869  | 3/2000  |   |           |
| JP | 2000-091873  | 3/2000  |   |           |
| JP | 2001-189637 A | 7/2001 |   |           |
| JP | 2001-267879  | 9/2001  |   |           |
| JP | 2002-043887  | 2/2002  |   |           |
| WO | 97/10646     | 3/1997  |   |           |

OTHER PUBLICATIONS

Kazuhiro Hirota et al.; "New SPUDT Structure and Improved Type of Distributed–Element Equivalent Circuit for SAW Grating"; Technical Report of the Institute of Electronics, Information and Communication Engineers (IEICE); Sep. 25, 1997; vol. 97; No. 276 (US 97–47); pp. 17–24.

(Continued)

Primary Examiner—Thomas M. Dougherty
(74) Attorney, Agent, or Firm—Keating & Bennett, LLP (57) ABSTRACT

A surface acoustic wave device includes an asymmetrical double electrode which prevents a mismatch between reflected waves and propagating surface acoustic waves on strips, and which is capable of realizing a superior unidirectionality. This surface acoustic wave device includes the asymmetrical double electrode in which a half wavelength section includes first and second strips which have mutually different widths. The half wavelength is arranged to define a basic section. The surface acoustic wave device includes at least two of these basic sections disposed on a piezoelectric substrate. The absolute value of the vector angle of the reflection center is within approximately 45±10° or within approximately 135±10°, when the center of the basic section is the reference position. Alternatively, the absolute value of the phase difference between the excitation center and the reflection center is within approximately 45±10° or approximately 135±10°.

5 Claims, 9 Drawing Sheets

U.S. PATENT DOCUMENTS

| | | | |
|---|---|---|---|
| 5,274,345 A | | 12/1993 | Gau |
| 5,313,177 A | * | 5/1994 | Hickernell et al. ......... 333/193 |
| 5,545,940 A | | 8/1996 | Wright |
| 5,793,146 A | | 8/1998 | Wright |
| 6,049,155 A | | 4/2000 | Graebner et al. |
| 6,075,426 A | * | 6/2000 | Tsutsumi et al. ........... 333/193 |
| 6,104,260 A | | 8/2000 | Yamada et al. |
| 6,127,904 A | * | 10/2000 | Tanaka et al. .............. 333/193 |
| 6,211,600 B1 | * | 4/2001 | Martin ................... 310/313 D |
| 6,246,150 B1 | * | 6/2001 | Mitobe ................... 310/313 B |
| 6,329,888 B1 | | 12/2001 | Hirota |
| 6,462,633 B1 | | 10/2002 | Ichikawa |
| 6,580,199 B2 | * | 6/2003 | Mitobe ................... 310/313 B |
| 6,710,683 B2 | * | 3/2004 | Nakamura et al. .......... 333/193 |
| 6,759,788 B2 | * | 7/2004 | Sato ....................... 310/313 B |
| 6,806,619 B2 | * | 10/2004 | Nakamura et al. ...... 310/313 B |
| 6,841,918 B2 | * | 1/2005 | Kando ................... 310/313 B |
| 2002/0033650 A1 | * | 3/2002 | Kando ................... 310/313 B |
| 2002/0125970 A1 | * | 9/2002 | Tsuzuki et al. ............. 333/193 |
| 2002/0158715 A1 | * | 10/2002 | Nakamura et al. .......... 333/193 |

OTHER PUBLICATIONS

Hajime Kando; "Surface Acoustic Wave Device"; U.S. Appl. No. 09/887,173; filed Jun. 22, 2001.

Hajime Kando; "Surface Acoustic Wave Device"; New U.S. Appl. No. unknown; filed Nov. 18, 2004.

* cited by examiner

SURFACE ACOUSTIC WAVE DEVICE

This application is a Divisional Application of U.S. patent application Ser. No. 09/887,173 filed Jun. 22, 2001 now U.S. Pat. No. 6,841,918.

BACKGROUND OF THE INVENTION

1. Field of the Invention

The present invention relates to a surface acoustic wave device for use in, for example, a resonator or a filter, and more particularly, to a surface acoustic wave device having an asymmetrical double electrode used as a unidirectional interdigital transducer or a dispersive reflection type reflector.

2. Description of the Related Art

A surface acoustic wave device such as a surface acoustic wave filter is widely used in mobile communication equipment or broadcasting equipment, or other such apparatuses. Particularly because the surface acoustic wave device is compact, lightweight, tuning-free and easy to manufacture, the surface acoustic wave device is suitable for an electronic component for use in portable communication equipment.

The surface acoustic wave device is broadly divided into a transversal type filter and a resonator-type filter, based on its structure. In general, the transversal type filter has advantages of having (1) a small group delay deviation, (2) a superior phase linearity, and (3) a high degree of flexibility in the pass band design based on weighting. However, the transversal type filter has a disadvantage of having a large insertion loss.

An interdigital transducer (hereinafter referred to as an "IDT") used in a surface acoustic wave filter transmits and receives surface acoustic waves with respect to both sides of an IDT, that is, the IDT transmits and receives surface acoustic waves bilaterally in an equal manner. For example, in a transversal type filter in which two IDTs are spaced apart from each other by a predetermined distance, one half of the surface acoustic waves transmitted from one IDT is received by the other IDT, but the surface acoustic waves propagated from the one IDT to the opposite side of the other IDT become a loss. This loss is called a "two-way loss", and has become a big factor in increasing insertion loss of a transversal type filter.

In order to reduce the above-described two-way loss, various types of unidirectional IDTs have been proposed. In such unidirectional IDTs, surface acoustic waves are transmitted and received at only one side alone thereof. Also, low-loss transversal type filters which utilize these unidirectional IDTs have been developed.

Figure 14:
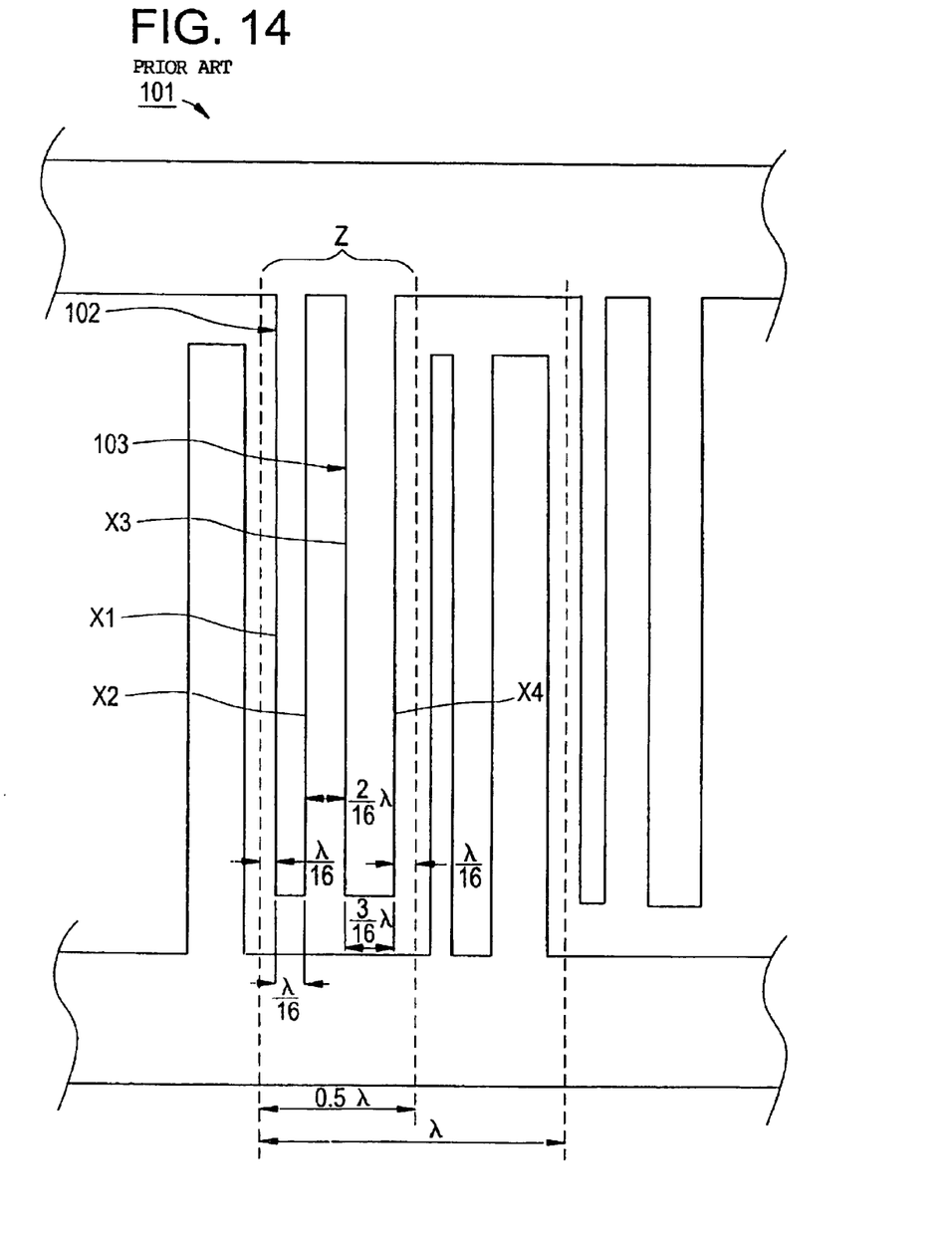
FIG. 14 is a schematic partially cutaway plan view showing a conventional asymmetrical double electrode.

For example, Hanma et al., have proposed an asymmetrical double electrode in "A TRIPLE TRANSIT SUPPRESSION TECHNIQUE" 1976 IEEE Ultrasonics Symposium Proceedings pp. 328–331. FIG. 14 is a schematic partially cutaway plan view showing the asymmetrical double electrode disclosed in this prior art.

In an asymmetrical double electrode 101, half wavelength sections Z constituted of two strips 102 and 103 having different widths from each other, are disposed repeatedly many times along the propagation direction of surface acoustic waves. Such an electrode defined by half-wavelength sections Z constituted of two strips having different widths from each other, is called an "unbalanced double electrode" or a "asymmetrical double electrode".

The width of a half wavelength section is set to $0.5\lambda$. The width of a strip 102 having a relatively narrow width is set to $\lambda/16$. The width of a strip 103 having a relatively wide width is set to $3\lambda/16$. The width of a gap between the strips 102 and 103 is set to $2\lambda/16$. The width of an outer gap of the strip 102 in the half wavelength section is set to $\lambda/16$. The width of the outer gap of the strip 103 in the propagation direction of surface acoustic waves in the half wavelength section is set to $\lambda/16$.

Between adjacent basic sections, the electrical polarities are opposite to each other.

Figure 15:
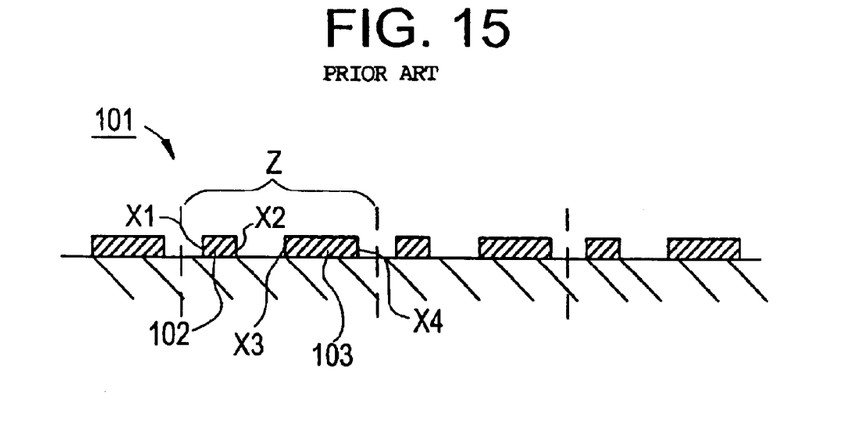
FIG. 15 is a partially cutaway sectional view for explaining the edge positions of the strips in the asymmetrical double electrode shown in FIG. 14.
Figure 16:
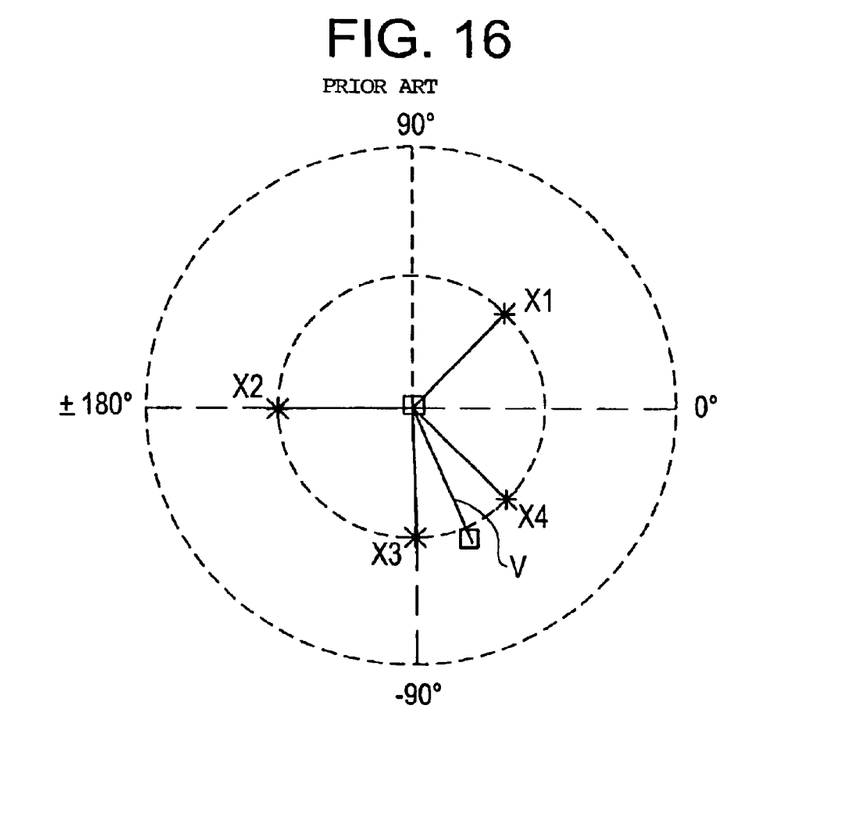
FIG. 16 is a diagram showing the relationship between the reflection vectors in the edges X1 to X4 shown in FIG. 15 and the resultant vector V thereof.

In the above-described asymmetrical double electrode, a reflection per basic section can be expressed by a resultant vector that is generated by synthesizing reflected waves from the edges X1 to X4 of the strips 102 and 103 shown in FIG. 15. FIG. 16 shows the reflection vectors at the edges X1 to X4 when the reference position is set to the center of a basic section, and the resultant vector thereof. As can be seen from FIG. 16, the resultant vector V is located at an angle of 67.5°, and the reflection center is located at an angle of 67.5°/2=33.75°.

Also, in this asymmetrical double electrode, the outer edge X1 of the strip 102 and the outer edge X4 of the strip 103 are disposed bilaterally symmetrically with respect to the center of the half wavelength section. Hence, the distances between the center of a basic section and the outer edges of the nearest strips in the adjacent basic sections, are also equal to each other. In the asymmetrical double electrode, therefore, an excitation center is located at the center of the basic section Z, with a phase difference of about 33.75° generated between an excitation center and the reflection center. Thus, the asymmetrical double electrode operates as a unidirectional electrode.

Table 1 below shows the inter-mode coupling coefficient $\kappa_{12}/k_0$, the phase difference between the excitation center $\psi$ and the reflection center $\phi$, and the reflection center $\phi$, when forming an asymmetrical double electrode of aluminum film having a 3% film-thickness on a ST-cut crystal quartz substrate, as an example of the above-described asymmetrical double electrode.

TABLE 1

| Item | Calculated value |
| --- | --- |
| Inter-mode coupling coefficient $\kappa_{12}/k_0$ | 0.00257 |
| Phase difference between excitation center $\psi$ and reflection center $\phi$ | 31.3° |
| Reflection center $\phi$ | 33.8° |

Here, $k_0$ is a wave number of surface acoustic waves propagating through an IDT. The ratio $\kappa_{12}/k_0$ and the phase difference between the excitation center $\psi$ and the reflection center $\phi$ can be obtained from the resonant frequency determined by the finite element method, using the technique of Obuchi et al., ("Evaluation of Excitation Characteristics of Surface Acoustic Wave Interdigital Electrode Based on Mode Coupling Theory", Institute of Electronics, Information and Communication Engineers of Japan, Technical Report MW90-62). Also, the reflection center $\phi$ is determined by the phase difference between the excitation center $\psi$ and the reflection center $\phi$, and the excitation center obtained from the fundamental wave component which is acquired by Fourier-transforming the electric charge density distribution on the electrode obtained by the finite element method.

Japanese Unexamined Patent Application Publication No. 61-6917 discloses an electrode which has implemented unidirectionality by disposing two strips having mutually different widths in a half wavelength section, as in the case of the above-described asymmetrical double electrode. The electrode disclosed in this Japanese Unexamined Patent Application Publication No. 61-6917 is also supposed to operate as a unidirectional electrode due to the asymmetry of the two strips thereof. However, in the method disclosed in the Japanese Unexamined Patent Application Publication No. 61-6917, no means for controlling the reflection center and the reflection amount are disclosed. In addition, no feasible reflection center and reflection amount are described.

The article "Direct Numeral Analysis SAW Mode Coupling Equation and Applications Thereof", 27th EM symposium preprint, pp. 109–116, Takeuchi et al., describes the principle of a unidirectional IDT which provides flat directivity over a wide band in the structure wherein positive and negative reflection elements are dispersively disposed in a unidirectional IDT. Herein, however, no means for forming a reliably superior unidirectional IDT are described.

In general, when surface acoustic waves are caused to be incident on an IDT constituted only of double strips without reflection, reflection is caused by re-excitation. As a result, in the case of a conventional transversal type filter, waves called "triple transit echo" or TTE, occur, and cause ripples or other undesired wave characteristics that adversely effect filter characteristics. The above-described literature by Hanma et al., discloses a method for canceling out reflection due to re-excitation by means of acoustic reflected waves of an asymmetrical double electrode. This method, however, has created a problem that new ripples are caused by acoustic reflection when the acoustic reflection is larger than the reflection caused by the re-excitation. Therefore, such a method for canceling out the reflection by re-excitation is subjected to the restriction of piezoelectric substrate material or electrode material, since the reflection vector length which represents the acoustic reflection amount is fixed in an asymmetrical double electrode.

On the other hand, the article "About One Weighting Method For SAW Reflector", 1999, General Convention of Institute of Electronics, Information and Communication Engineers of Japan, p. 279, Tajima et al., discloses a method for performing weighting with respect to the reflection coefficient of a reflector. This method uses a plurality of strips having mutually different widths and makes use of the change of the reflection coefficient of a strip based on the strip width. However, when the strip width is changed, the sonic speed is also changed. As a result, when attempting to perform weighting based on the strip width, a testing method and apparatus is needed to find a correct sonic speed and to change the arrangement pitch of the strip in accordance with this corrected sonic speed. This poses a problem that the design requires an extremely high degree of technique.

As described above, various IDTs or resonators each operating as a unidirectional electrode by asymmetry of two strips have been proposed, but conventional asymmetrical double electrodes have not yet achieved sufficient unidirectionality. In addition, the reflection center and the reflection amount of the conventional asymmetrical double electrodes have been very difficult to control.

SUMMARY OF THE INVENTION

In order to overcome the problems described above, preferred embodiments of the present invention provide a surface acoustic wave device using an asymmetrical double electrode which achieves more superior unidirectionality of surface acoustic wave propagation while effectively and easily controlling the reflection amount per basic section.

In accordance with a preferred embodiment of the present invention, a surface acoustic wave device includes a piezoelectric substrate, and including at least two basic sections including an asymmetrical double electrode in which a half wavelength section includes first and second strips having different widths from each other, the at least two basic sections being disposed along the propagation direction of surface acoustic waves. In this surface acoustic wave device, the absolute value of the vector angle of the reflection center obtained from the resultant vector generated by synthesizing the reflection vectors at the edges of the first and second strips is preferably within approximately 45±10° or approximately 135±10°, when the center of the each of the at least two basic sections is the reference position.

In accordance with another preferred embodiment of the present invention, a surface acoustic wave device includes a piezoelectric substrate, and including at least two basic sections including an asymmetrical double electrode in which a half wavelength section includes first and second strips having different widths from each other, the at least two basic sections being disposed along the propagation direction of surface acoustic waves. In this surface acoustic wave device, the absolute value of the phase difference between the excitation center and the reflection center of the asymmetrical double electrode, is preferably within approximately 45±10° or approximately 135±10°.

In accordance with a still another preferred embodiment of the present invention, a surface acoustic wave device includes a piezoelectric substrate, and including at least two basic sections including an asymmetrical double electrode in which a half wavelength section includes first and second strips having different widths from each other, the at least two basic sections being disposed along the propagation direction of surface acoustic waves. In this surface acoustic wave device, when the edge positions of the first and second strips are X1 to X4, each of which is a value corrected using the sonic speed difference between a free surface and a metallic surface, and when the resultant vector length of normalized reflected waves from the strip edges is $|\Gamma|$, and the center position of the basic section is $0(\lambda)$, and $X1 \cong -X4$, each of the positions of X2 and X3 is a value substantially satisfying the following equations (1) and (2).

Mathematical Expression 4

$$X2[\lambda] = A \times X1[\lambda]^2 + B \times X1[\lambda] + C \pm 0.1[\lambda] \qquad (1)$$

Mathematical Expression 5

$$X3[\lambda] = D \times X1[\lambda]^2 + E \times X1[\lambda] + F \pm 0.05[\lambda] \qquad (2)$$

Mathematical Expression 6

$$A = -34.546 \times |\Gamma|^6 + 176.36 \times |\Gamma|^5 - 354.19 \times |\Gamma|^4 + 354.94 \times |\Gamma|^3 - 160.44 \times |\Gamma|^2 + 10.095 \times |\Gamma| - 1.7558$$

$$B = -15.464 \times |\Gamma|^6 + 77.741 \times |\Gamma|^5 - 153.44 \times |\Gamma|^4 + 147.20 \times |\Gamma|^3 - 68.363 \times |\Gamma|^2 + 6.3925 \times |\Gamma| - 1.7498$$

$$C = -1.772 \times |\Gamma|^6 + 8.7879 \times |\Gamma|^5 - 17.07 \times |\Gamma|^4 + 16.092 \times |\Gamma|^3 - 7.4655 \times |\Gamma|^2 + 0.8379 \times |\Gamma| - 0.3318$$

$$D = 12.064 \times |\Gamma|^6 - 45.501 \times |\Gamma|^5 + 57.344 \times |\Gamma|^4 - 22.683 \times |\Gamma|^3 + 12.933 \times |\Gamma|^2 - 15.938 \times |\Gamma| - 0.1815$$

$$E = 7.2106 \times |\Gamma|^6 - 30.023 \times |\Gamma|^5 + 45.792 \times |\Gamma|^4 - 29.784 \times |\Gamma|^3 + 13.125 \times |\Gamma|^2 - 6.3973 \times |\Gamma| + 1.0203$$

$$F = 1.0138 \times |\Gamma|^6 - 4.4422 \times |\Gamma|^5 + 7.3402 \times |\Gamma|^4 - 5.474 \times |\Gamma|^3 + 2.3366 \times |\Gamma|^2 - 0.7540 \times |\Gamma| + 0.2637$$

In the surface acoustic wave device in accordance with another preferred embodiment of the present invention, it is preferable that the reflection amounts of the surface acoustic waves at the edge positions X1 to X4 of the above-described strips be substantially equal to one another.

Also, in the surface acoustic wave device in accordance with other preferred embodiments of the present invention, the above-described asymmetrical double electrode may be an interdigital transducer, or may instead be a reflector.

Furthermore, in accordance with another preferred embodiment of the present invention, preferably, quartz crystal is preferably used as the above-described piezoelectric substrate. Alternatively, however, in other preferred embodiments of the present invention, the piezoelectric substrate may be constituted of another piezoelectric single crystal such as $LiTaO_3$, or a piezoelectric ceramic such as lead titanate zirconate-based ceramic. Also, a piezoelectric substrate constructed by forming a piezoelectric thin-film such as a ZnO thin-film on an insulative substrate such as a piezoelectric substrate or alumina substrate, may be used.

The above and other elements, characteristics, features, and advantages of the present invention will be clear from the following detailed description of preferred embodiments of the present invention in conjunction with the accompanying drawings.

DETAILED DESCRIPTION OF PREFERRED EMBODIMENTS

In order to realize the unidirectionality using an asymmetrical double electrode, the inventors of the present application have conducted extensive research and have discovered that, when the reflection amount of surface acoustic waves per basic section is small, the frequency unidirectionality characteristics of the unidirectional electrode can be estimated by forming reflection elements using a unidirectional electrode wherein the phase difference between the excitation center and the reflection center is approximately +45° (−135°) or approximately −45° (+135°), and by disposing these positive and negative reflection elements, regarding them as positive and negative impulses, respectively. Furthermore, the present inventors have discovered that, when the phase difference between the excitation center and the reflection center largely deviates from approximately ±45° (±135°) in the positive and negative elements, it becomes difficult to regard as the positive and negative elements as simple positive and negative impulses, respectively, because of the phase mismatching of surface acoustic waves.

Moreover, the present inventors have discovered that, when a weighting method in a unidirectional IDT using an asymmetrical double electrode is used, it is possible to perform weighting with respect to reflection coefficients, when positive and negative reflection elements wherein the reflection centers thereof are located at angles of approximately +45° (−135°) and −45° (+135°), respectively, with respect to the center of a half wavelength section, are formed and are utilized as a reflector. When attempting to perform weighting to the strip width, it has been necessary to change the electrode pitch. However, this weighting method by reflection coefficient allows a reflector to be easily produced, since sonic speeds of the positive and negative elements are identical with each other.

Next, the principles of various preferred embodiments of the present invention will be described in more detail with reference to the drawings.

Figure 1A:
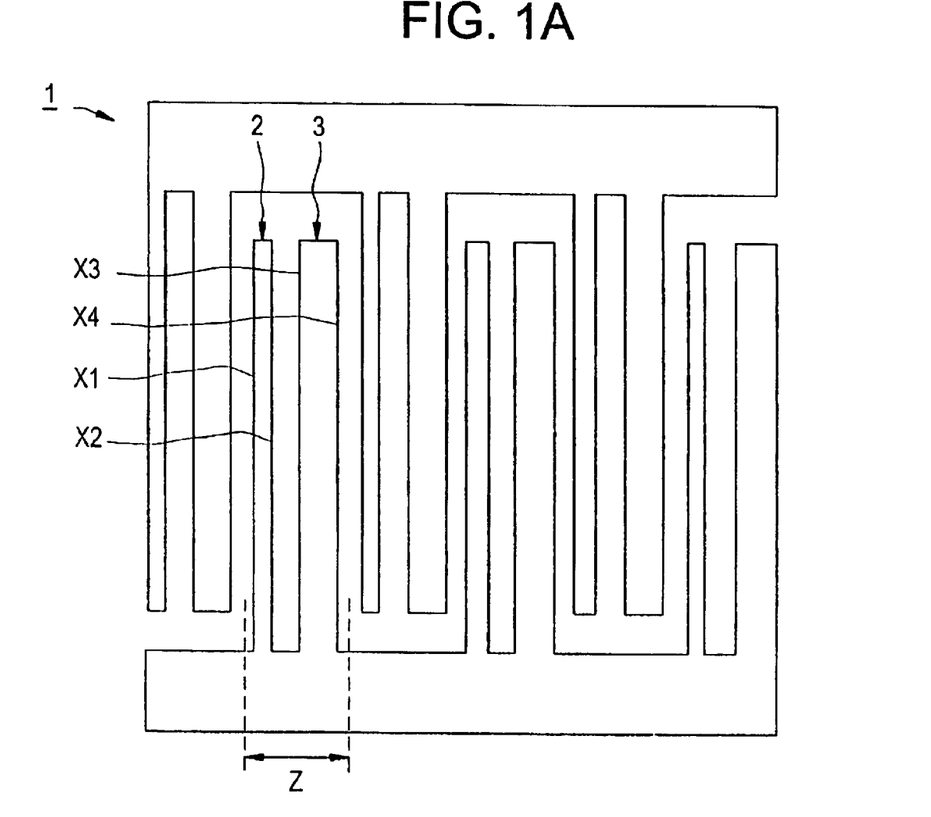
FIG. 1A is a plan view of an asymmetrical double electrode in accordance with a preferred embodiment of the present invention.
Figure 1B:
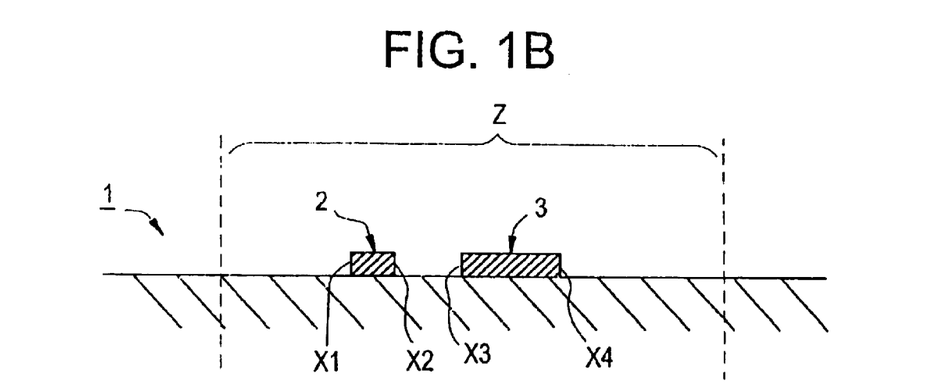
FIG. 1B is a partially cutaway sectional view of an asymmetrical double electrode in accordance with a preferred embodiment of the present invention.

An asymmetrical double electrode 1 shown in FIGS. 1A and 1B is taken as an example. In this asymmetrical double electrode 1, basic sections Z each of which is constituted of strips 2 and 3 having mutually different widths, are repeatedly arranged in the propagation direction of surface acoustic waves. Now, let one basic section be disposed at the positions from $-0.25\lambda$ to $+0.25\lambda$. Here, $\lambda$ denotes the wavelength of a surface acoustic wave.

Letting the positions of the edges of the first and second strips 2 and 3 be disposed within this basic section, that is, this half wavelength section be X1' to X4', and the sonic speed of surface acoustic waves propagating through a free surface be $V_f$, and the sonic speed of surface acoustic waves propagating through a metallic surface be $V_m$, the edge positions X1 to X4 corrected based on the sonic speeds of the free surface and the metallic surface are expressed by the following equation:

Mathematical Expression 7

$$X1 \text{ to } X4 = (V_f L_m + V_m L_f)/(V_f L_{m0} + V_m L_{f0}) \quad (3)$$

In the above equation (3), $L_m$ denotes the sum of the distance on the metallic surface from the center of the half wavelength section, that is, 0λ to X1 to X4 in the propagation direction of surface acoustic waves, and $L_f$ denotes the sum of the distance on the free surface from the center of the half wavelength section, 0λ to X1 to X4. $L_{m0}$ denotes the sum of the distance of the metallic surface in the entire half wavelength section, and $L_{f0}$ denotes the sum of the distance of the free surface in the entire half wavelength section.

Next, the reflection in a single electrode in which only a single strip is disposed within the half wavelength section, will be discussed. Suppose that the single strip is arranged so that the center thereof is located at the reference position 0λ of the half wavelength section Z. Letting the reflection vector at the one edge position −Xs of the single strip be Γs1, and the reflection vector at the other edge position +Xs thereof be Γs2, the resultant reflection vector Γs at the reference position is expressed by the equation (4) below. Here, j in the equation (4) denotes an imaginary number, and k denotes the wave number.

Mathematical Expression 8

$$\Gamma s = \Gamma s1 \times e^{-2 \cdot j \cdot k \cdot (-Xs)} + \Gamma s2 \times e^{-2 \cdot j \cdot k \cdot Xs} \quad (4)$$

The length |Γs| of the above-described resultant vector Γs denotes the reflection amount of a single strip.

Here, when conducting a normalization such as |Γs1|=|Γs2|=1, we can express Γs1=−Γs2=−1 under the condition that the acoustic impedance on a free surface is larger than that on a metallic surface. Therefore, when defining the reflection center φs as the center of the single strip, the reflection center φs can be determined by the following equation (5), using the angle ∠Γ of the resultant reflection vector Γ.

Mathematical Expression 9

$$\phi s = -0.5 \times \angle (j \times \Gamma s) \quad (5)$$

Next, discussion will be made of an asymmetrical double electrode wherein two strips having mutually different widths are disposed in the half wavelength section, as in the case of the single strip. Letting the reflection vectors of surface acoustic waves at the edge positions X1 to X4 in FIGS. 1A and 1B be Γ1 to Γ4, the resultant reflection vector Γ at the reference position 0λ is expressed by the equation (6) below.

Mathematical Expression 10

$$\Gamma = \Gamma 1 \times e^{-2 \cdot j \cdot k \cdot X1} + \Gamma 2 \times e^{-2 \cdot j \cdot k \cdot X2} + \Gamma 3 \times e^{-2 \cdot j \cdot k \cdot X3} \Gamma 4 \times e^{-2 \cdot j \cdot k \cdot X4} \quad (6)$$

The length |Γ| of the above-described resultant vector Γ denotes the reflection amount of a unidirectional electrode. The reflection center of the unidirectional electrode is defined in the same way as the single strip, and is expressed by the equation (7) below.

Mathematical Expression 11

$$\phi = -0.5 \times \angle (j \times \Gamma) \quad (7)$$

In the case where, in the asymmetrical double electrode, a unidirectional IDT is constructed such that the electric polarities of adjacent basic sections are alternately inverted, when the width of the inter-strip gap between a basic section and the adjacent basic section on one side in the propagation direction of surface acoustic waves, and the width of the inter-strip gap between the basic section and the adjacent basic section on the other side in the propagation direction of surface acoustic waves, are equal to each other, and simultaneously when these inter-strip gaps are disposed symmetrically with respect to the center of the center basic section, the excitation center of the asymmetrical double electrode is located at the substantially central portion of the half wavelength section.

Figure 2:
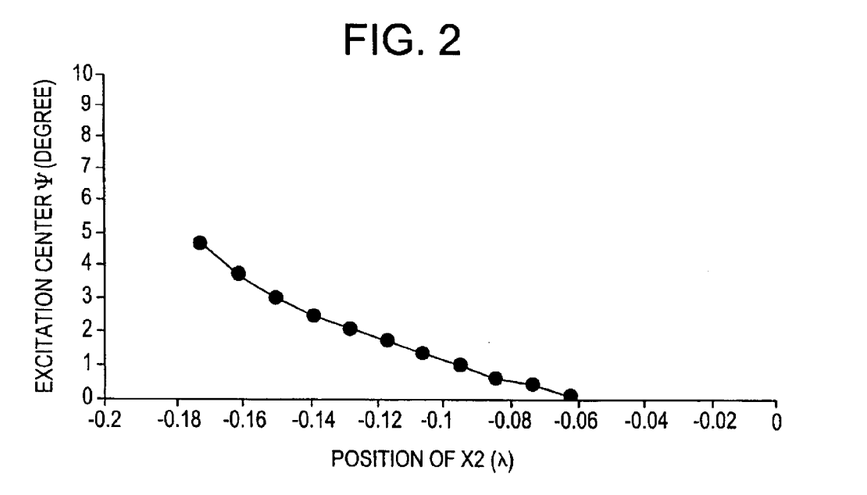
FIG. 2 is a diagram showing the edge-position dependence of the excitation center of the asymmetrical double electrode in a preferred embodiment of the present invention.
Figure 3:
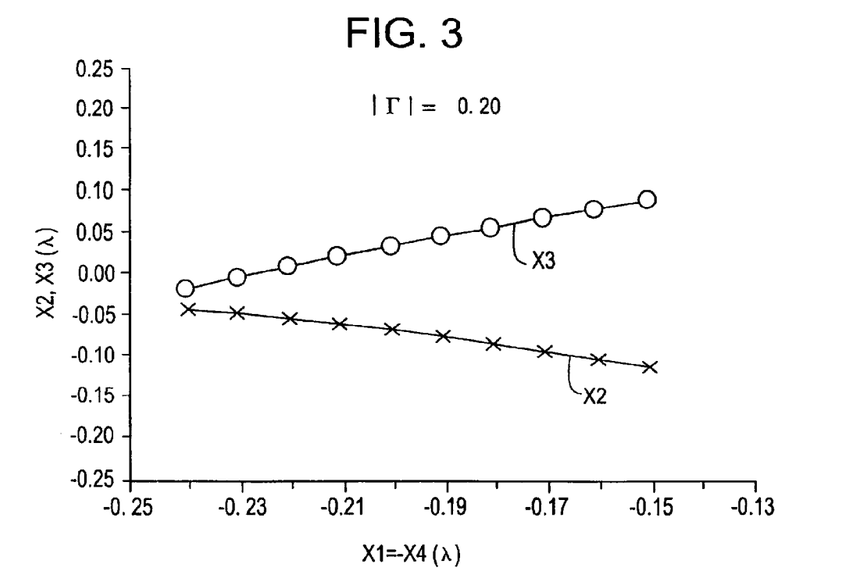
FIG. 3 is a diagram showing the relationship between the edge position X1=−X4 and each of the edge positions X2 and X3, when a resultant vector length $\Gamma$ is $0.20\lambda$.
Figure 4:
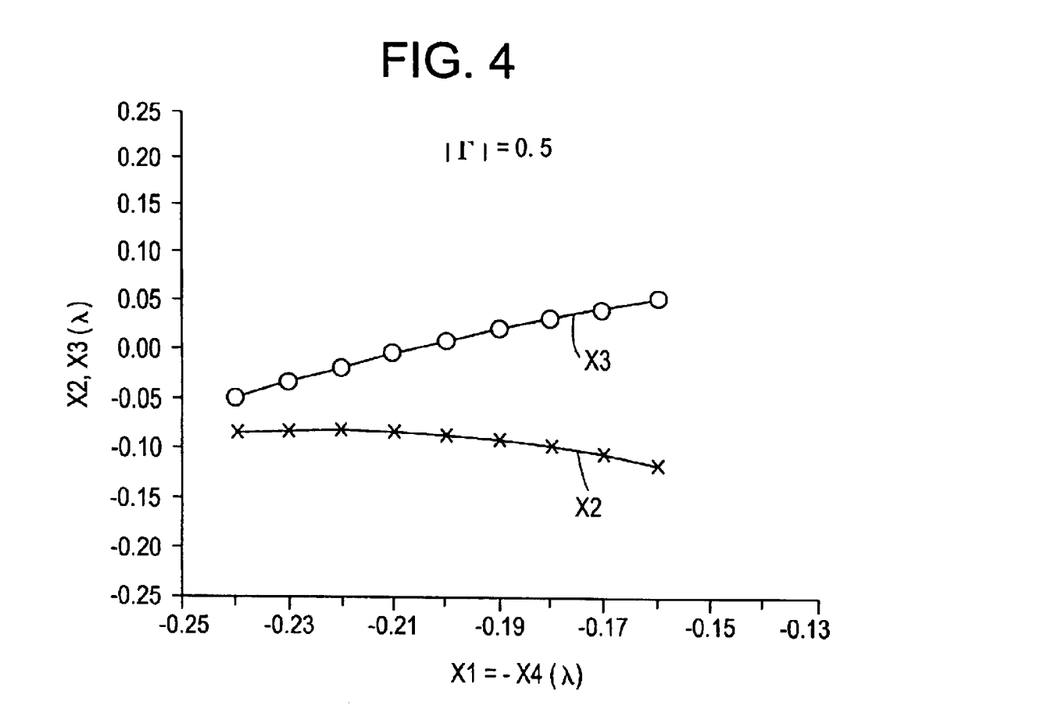
FIG. 4 is a diagram showing the relationship between the edge position X1=−X4 and each of the edge positions X2 and X3, when a resultant vector length $\Gamma$ is $0.50\lambda$.
Figure 5:
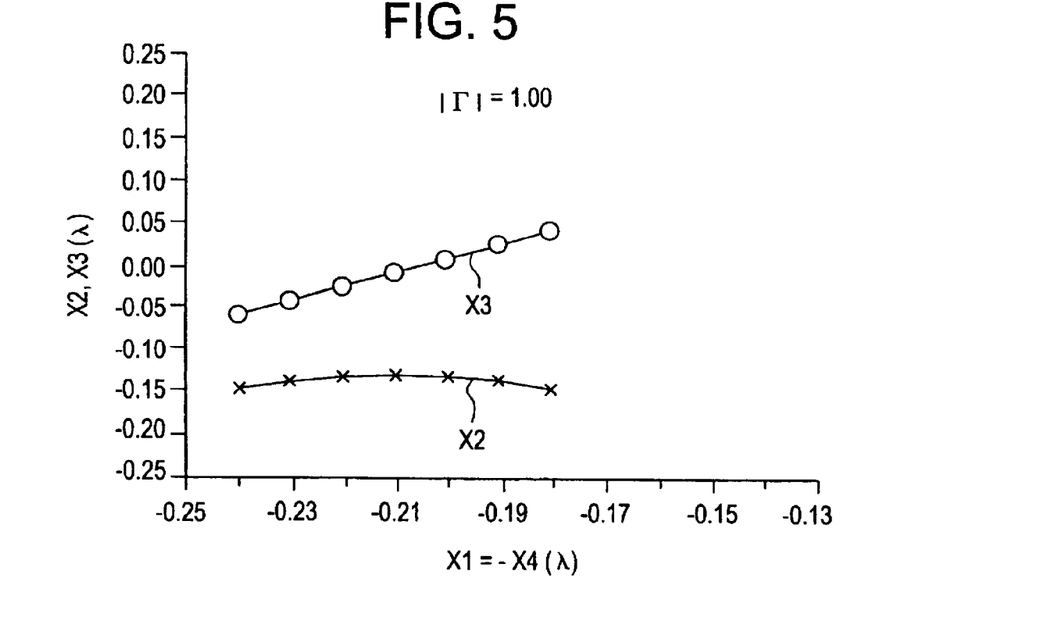
FIG. 5 is a diagram showing the relationship between the edge position X1=−X4 and each of the edge positions X2 and X3, when a resultant vector length $\Gamma$ is $1.00\lambda$.
Figure 6:
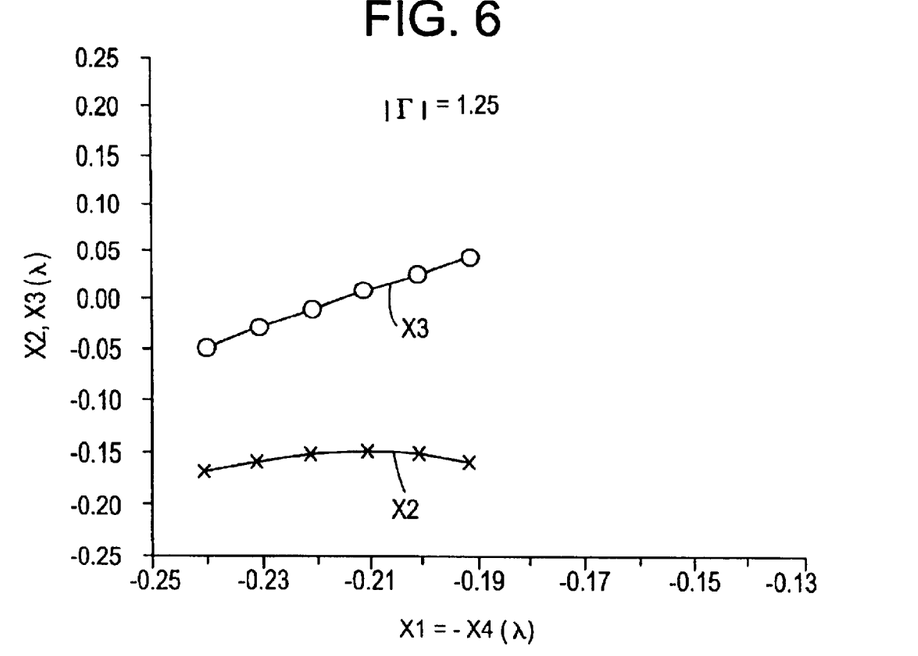
FIG. 6 is a diagram showing the relationship between the edge position X1=−X4 and each of the edge positions X2 and X3, when a resultant vector length $\Gamma$ is $1.25\lambda$.
Figure 7:
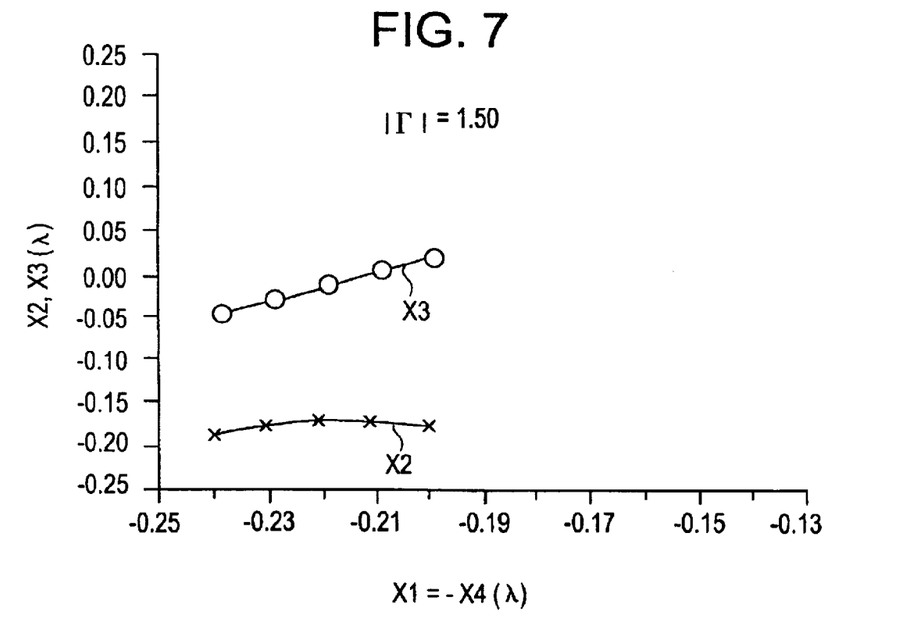
FIG. 7 is a diagram showing the relationship between the edge position X1=−X4 and each of the edge positions X2 and X3, when a resultant vector length $\Gamma$ is $1.50\lambda$.
Figure 8:
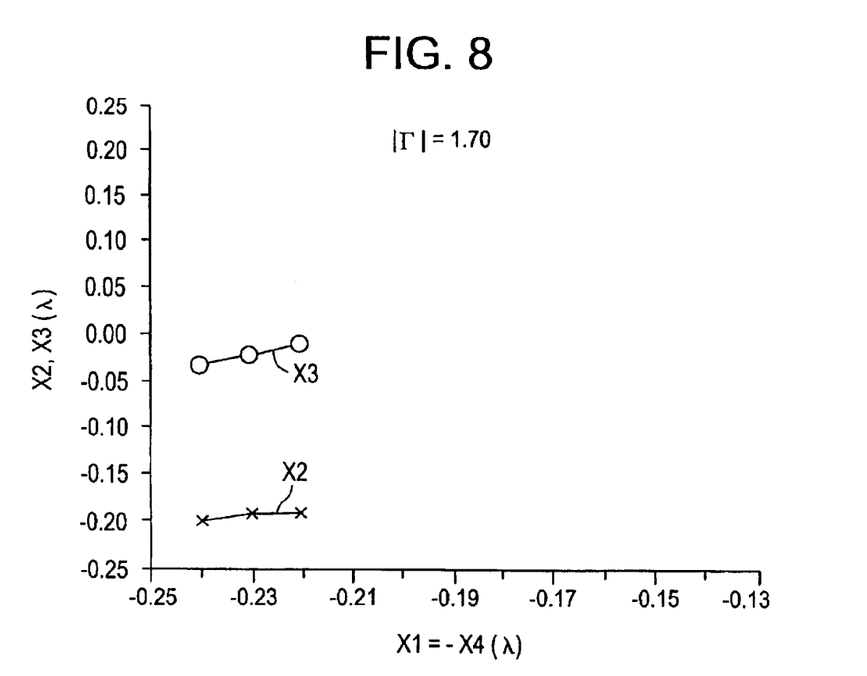
FIG. 8 is a diagram showing the relationship between the edge position X1=−X4 and each of the edge positions X2 and X3, when a resultant vector length $\Gamma$ is $1.70\lambda$.

FIG. 2 is a diagram showing the edge-position dependence of the excitation center in the above-described asymmetrical double electrode. Herein, an asymmetrical double electrode formed of an aluminum film having a thickness of, for example, approximately 0.02λ, is disposed on a ST-cut quartz substrate. In this figure, there is shown the edge position dependence of the excitation center obtained from the fundamental wave component which is acquired by Fourier-transforming the electric charge density distribution on the electrode obtained by the finite element method, when X1=−X4=−0.1875λ, and X3−X2=0.125λ, and when X2 is used as a parameter.

It can be confirmed that even at a position wherein the degree of asymmetry of the asymmetrical double electrode is very high, that is, at X2=0.172λ, the vector angle of the excitation center is located at about +4.6°, that is, substantially at the central portion. The strip width and the gap width of an IDT constituting a surface acoustic wave device is restricted by the electrical resistance of a strip and/or the patterning process.

The edge positions X and X3 can be uniquely determined with respect to the |Γ| and the edge position X1, by letting X2−X1>0.02λ, X3−X2>0.02λ, X4−X3>0.02λ, and X4=−1, assuming that the vector lengths of Γ1 to Γ4 are equal to one another, performing a normalization such that Γ1=Γ4=−1, Γ2=Γ3=+1, and finding the conditions such that the equations (6) and (7) satisfies φ=45°, by the Monte Carlo method. The approximate equations expressing X2 and X3 are given by the following expressions (8) and (9), using |Γ| and X1 as independent variables.

Mathematical Expression 12

$$X2[\lambda] \approx A \times X1[\lambda]^2 + B \times X1[\lambda] + C \quad (8)$$

Mathematical Expression 13

$$X3[\lambda] \approx D \times X1[\lambda]^2 + E \times X1[\lambda] + F \quad (9)$$

In the equations (8) and (9), A to F are obtained by the following equations.

Mathematical Expression 14

$A = -34.546 \times |\Gamma|^6 + 176.36 \times |\Gamma|^5 - 354.19 \times |\Gamma|^4 + 354.94 \times |\Gamma|^3 - 160.44 \times |\Gamma|^2 + 10.095 \times |\Gamma| - 1.7558$ $B = -15.464 \times |\Gamma|^6 + 77.741 \times |\Gamma|^5 - 153.44 \times |\Gamma|^4 + 147.20 \times |\Gamma|^3 - 68.363 \times |\Gamma|^2 + 6.3925 \times |\Gamma| - 1.7498$ $C = -1.772 \times |\Gamma|^6 + 8.7879 \times |\gamma|^5 - 17.07 \times |\Gamma|^4 + 16.092 \times |\Gamma|^3 - 7.4655 \times |\Gamma|^2 + 0.8379 \times |\gamma| - 0.3318$ $D = 12.064 \times |\Gamma|^6 - 45.501 \times |\Gamma|^5 + 57.344 \times |\Gamma|^4 - 22.683 \times |\Gamma|^3 + 12.933 \times |\Gamma|^2 - 15.938 \times |\Gamma| - 0.1815$ $E = 7.2106 \times |\Gamma|^6 - 30.023 \times |\Gamma|^5 + 45.792 \times |\Gamma|^4 - 29.784 \times |\Gamma|^3 + 13.125 \times |\Gamma|^2 - 6.3973 \times |\Gamma| + 1.0203$ $F=1.0138\times|\Gamma|^6-4.4422\times|\Gamma|^5+7.3402\times|\Gamma|^4-5.474\times|\Gamma|^3+2.3366\times|\Gamma|^2-0.7540\times|\Gamma|+0.2637$ From the above results, it can be recognized that an asymmetrical double electrode which corresponds to a desired reflection amount, and having the reflection center at an angle of about 45° can be obtained. As can further be recognized, in an asymmetrical double electrode which is constructed in accordance with the equations described above, the excitation center is located at the center of a half wavelength section. As a result, when this asymmetrical double electrode is used as a unidirectional electrode, the phase difference between the excitation and the reflection center becomes substantially 45°, allowing this asymmetrical double electrode to operate as a unidirectional electrode having very superior characteristics.

As examples, FIGS. 3 to 8 show the results of X2 and X3 obtained by equations (8) and (9), for $|\Gamma|=0.20\lambda$, $0.50\lambda$, $1.00\lambda$, $1.25\lambda$, $1.50\lambda$, and $1.70\lambda$. Meanwhile, in the above description, the reflection coefficient has been treated based on the premise that the acoustic impedance on a free surface is larger that that on a metallic surface. Conversely, under the condition that the acoustic impedance on a free surface is smaller that that on a metallic surface, only the sign of $|\Gamma|$ is reversed, or in other words, that $\phi$ is shifted by 90°.

As described above, by selecting the edge positions X2 and X3 so as to satisfy the equations (8) and (9), the phase difference between the excitation center and the reflection center can be made substantially 45°. As a result, a very superior unidirectional electrode can be achieved. However, the present inventors have confirmed that this asymmetrical double electrode has a very excellent unidirectionality, if X2 and X3 are located not only at the positions satisfying the equations (8) and (9), but also at the positions within a certain range from the positions satisfying the equations (8) and (9). This fact will be described with reference to FIGS. 9 and 10.

Figure 9:
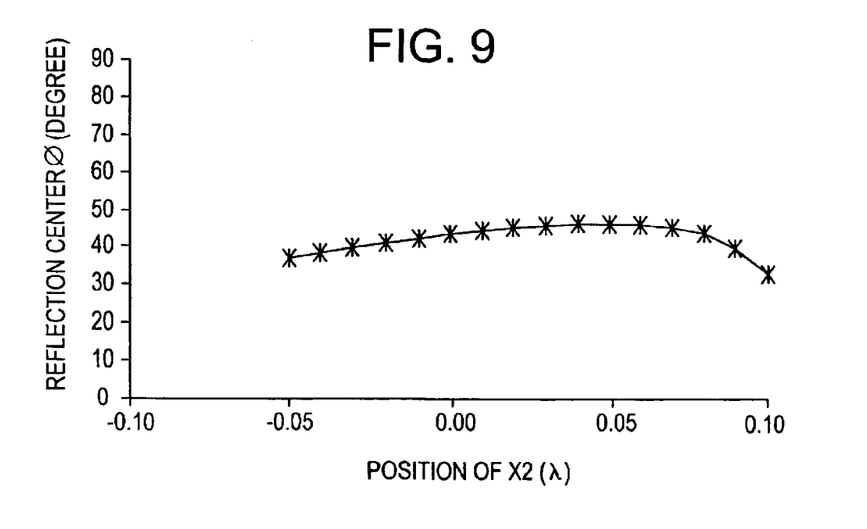
FIG. 9 is a diagram showing the change in the reflection center $\phi$ when the edge position X2 obtained by the equation (1) changes, in preferred embodiments of the present invention.
Figure 10:
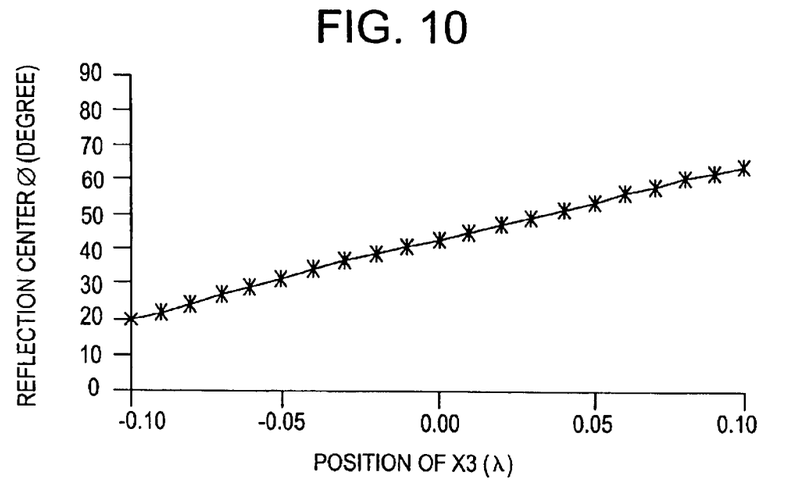
FIG. 10 is a diagram showing the change in the reflection center $\phi$ when the edge position X3 changes in preferred embodiments of the present invention.

FIGS. 9 and 10 are diagrams each showing the changes in the reflection center when X2 and X3, each obtained by substituting $|\Gamma|=1.5$ and $X1=-0.2188\lambda$ into the equations (8) and (9), within the range from $-0.1\lambda$ to $+0.1\lambda$.

As described above, it is desirable that the reflection center be located at an angle of approximately 45°, or the phase difference between the reflection center and the excitation center be approximately 45°, but the present inventors have confirmed that the range within approximately 45+10° would allow the phase mismatching to be greatly improved as compared to the above-described prior art asymmetrical double electrode. It can be seen from FIGS. 9 and 10 that the range such that the position of the reflection center is at an angle of approximately 45+10°, corresponds to the range of about $\pm0.10\lambda$ with respect to the value obtained by the equation (8) for the position of X2, and corresponds to the range of about $\pm0.05\lambda$ with respect to the value obtained by the equation (9) for the position of X3.

In preferred embodiments of the present invention, therefore, the positions of X2 and X3 are preferably within the range shown in the above-described equations (1) and (2). It will be understood that a superior unidirectionality can be realized as a result of this unique arrangement.

A surface acoustic wave device using an asymmetrical double electrode in accordance with preferred embodiments of the present invention was constructed as illustrated in FIG. 1. An IDT was constructed by forming an aluminum film having a thickness of, for example, approximately $0.02\lambda$ on a ST-cut quartz substrate, and then performing patterning.

The IDT defining an asymmetrical double electrode was constructed in accordance with the edge positions X2 and X3 which were determined by substituting the values of $|\Gamma|$ and X1 shown in Table 2 below into the equations (8) and (9). Table 2 shows the inter-mode coupling coefficients $\kappa_{12}/k_0$ and the reflection centers $\phi$ in this case.

In the asymmetrical double electrode, shown in FIG. 2, which is constructed based on the equations (8) and (9), since the angle of the reflection center is close to 45°, the phase mismatching of the reflected waves with respect to the propagating waves is significantly less than that of the conventional asymmetrical double electrode. Therefore, the use of the asymmetrical double electrode constructed based on the equations (8) and (9), allows a surface acoustic wave device which performs much better than the conventional surface acoustic wave devices to be achieved, and is particularly effective when positively making use of the reflection of strips.

TABLE 2

| $|\Gamma|$ | X1 [λ] | $\kappa_{12}/k_0$ | Reflection center $\phi$ [λ] |
|---|---|---|---|
| 0.20 | −0.19 | 0.0005 | 43.8 |
| 0.50 | −0.20 | 0.0015 | 42.3 |
| 0.75 | −0.20 | 0.0021 | 40.5 |
| 1.00 | −0.21 | 0.0029 | 39.6 |
| 1.25 | −0.21 | 0.0031 | 39.0 |
| 1.50 | −0.22 | 0.0036 | 39.2 |
| 1.60 | −0.22 | 0.0035 | 40.2 |
| 1.70 | −0.23 | 0.0038 | 41.5 |
| 1.73 | −0.23 | 0.0038 | 42.2 |

Next, description will be made of specific experimental examples of the directivity when an IDT including an symmetrical double electrode is provided on a ST-cut quartz substrate, in accordance with a preferred embodiment of the present invention.

Figure 11:
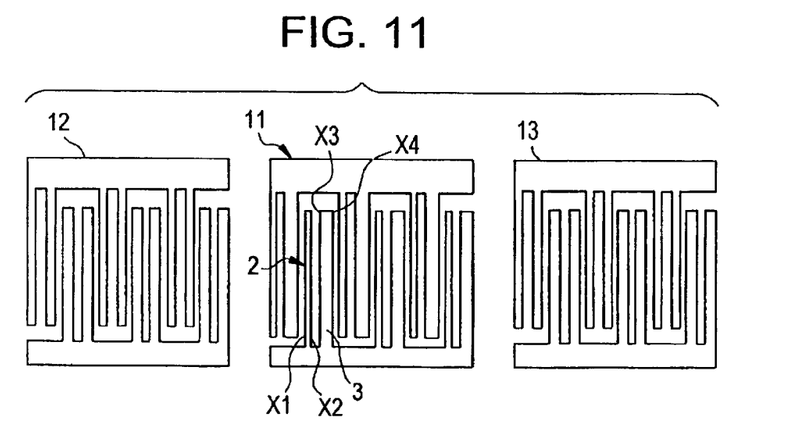
FIG. 11 is a schematic plan view showing the electrode structure, for evaluating directivity of an IDT in accordance with another preferred embodiment of the present invention.

As shown in FIG. 11, IDT 11, IDT 12, and IDT 13 were formed on a ST-cut quartz substrate (not shown) using an aluminum film having a thickness of, for example, approximately $0.02\lambda$. The middle IDT 11 is constituted of an asymmetrical double electrode in accordance with preferred embodiments of the present invention, and IDT 12 and IDT 13 disposed on the opposite sides of IDT 11 are ordinary double electrode type IDTs.

In IDT 11 constituted of an asymmetrical double electrode, when the edge portions of the first and second strips 2 and 3 having different widths are made asymmetric, the excitation center deviates from the center of the half wavelength section, so that the phase difference between the excitation and the reflection center also deviates from approximately 45°. Therefore, the edge positions X2 and X3 obtained by substituting $|\Gamma|=1.5$, and $X1=-0.2188\lambda$ into the equations (8) and (9), were adjusted by about $0.05\lambda$ and corrected so that the phase difference between the excitation and the reflection center approaches approximately 45°.

As a result, when $X1=-0.2188\lambda$, $X2=-0.1185\lambda$, $X3=+0.0050\lambda$, and $X4=+0.2188\lambda$, the phase difference between the excitation center and the reflection center became about 41°.

Figure 12:
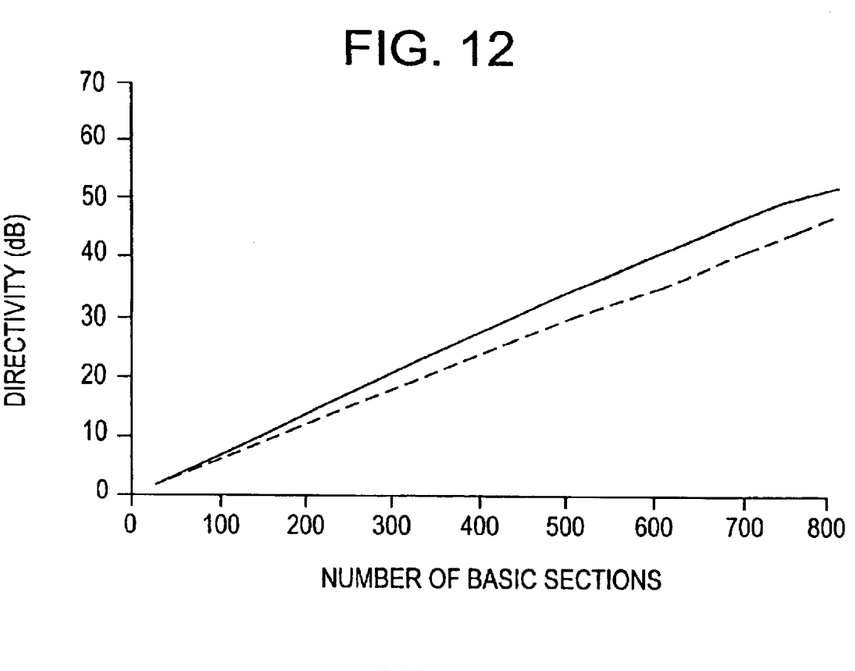
FIG. 12 is a diagram showing the relationship between the number of basic sections and the directivity, which relationship has been obtained in a further preferred embodiment of the present invention, and the relationship between the number of the basic sections and the directivity when using a conventional asymmetrical double electrode prepared for comparison.

FIG. 12 shows the comparison between the directivity of IDT 11 which uses the electrode structure shown in FIG. 11 and which includes the asymmetrical double electrode having the above-described construction, and the directivity when the conventional asymmetrical double electrode is disposed in place of IDT 11. The solid line in the figure shows the result of IDT 11, and the broken line shows that of the conventional example. With regard to the directivity, an input voltage is applied to IDT 11, then the output thereof received by IDT 12 and IDT 13 was sought, and the directivity was evaluated from the value of this output (dB).

For an IDT using an asymmetrical double electrode prepared for comparison, the film thickness of the electrode was preferably set to about 0.02λ, and the edge positions were preferably set so as to be X1=−0.1875λ, X2=−0.1250λ, X3=0λ, and X4=−+0.1875λ. The crossing width of an electrode finger was preferably set to about 20λ in each of the preferred embodiments and the conventional example.

For IDT 12 and IDT 13 on the opposite sides of IDT 11, the crossing width of an electrode finger were preferably set to about 20λ, and the edge positions were preferably set so as to be X1=−0.1875λ, X2=−0.0625λ, X3=+0.0625λ, and X4=+0.1875λ.

It can be recognized from FIG. 12 that the asymmetrical double electrode in this preferred embodiment has a better unidirectionality than that of the conventional asymmetrical double electrode. In addition, the present inventors have confirmed that the phase difference between the excitation center and the reflection center can be corrected so as to approach 45° by adjusting the edge positions X2 and X3 obtained by the equations (8) and (9) by about ±0.1λ, or by adjusting X4 so as to slightly depart from −X1.

Figure 13:
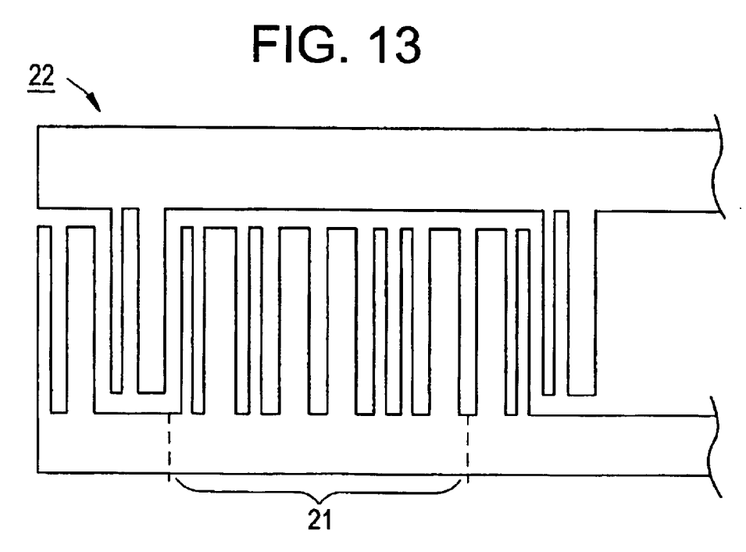
FIG. 13 is an explanatory plan view of the electrode structure of an IDT having a reflector in accordance with yet another preferred embodiment of the present invention.

FIG. 13 is a plan view showing the electrode structure of an IDT having an reflector 21 according to yet another preferred embodiment of the present invention. Herein, the reflector 21 constructed in accordance with this preferred embodiment of the present invention is preferably disposed within IDT 22. In this case, by performing weighting with respect to the reflection coefficient of the reflector 21, it is possible to control the frequency characteristics of the entire IDT 22 having the reflector 21.

The present invention is not limited to the above-described preferred embodiments, but can be variously modified. For example, in the above-described preferred embodiments, it is recognized that a better directivity than that of the conventional example is achieved. However, there may be a case, depending on the use, where it is more important that the phase difference between the excitation center and the reflection center is close to 45°, or that the reflection center when X1=−X4, is 45° with respect to the center of the half wavelength section, rather than achieving better directivity. Although it is desirable that the phase difference between the excitation center and the reflection center be about 45°, there may be a case where, when the reflection by a strip is positively utilized, for example, when it is used as a reflector, priority is given to the feature that the reflection center is located at an angle of 45°, over the feature that the excitation center is located at the center of the half wavelength section, even if the excitation center deviates therefrom. Particularly when a strip is utilized as a reflector, only the reflection center can be taken into consideration.

As is evident from the foregoing, in the surface acoustic wave device using an asymmetrical double electrode in accordance with various preferred embodiments of the present invention, the absolute value of the vector angle of the reflection center obtained from the resultant vector formed by synthesizing the reflection vectors at the edges X1 to X4 of the first and second strips when the center of the above-described basic section is set to be the reference position, is preferably within approximately 45±10° or approximately 135±10°. Thereby, the phase mismatching of surface acoustic waves is minimized, and the unidirectionality of the above-described asymmetrical double electrode is greatly improved.

Likewise, in various preferred embodiments of the present invention, when the absolute value of the phase difference between the excitation center and the reflection center of the asymmetrical double electrode, is within approximately 45±10° or approximately 135±10°, the phase mismatching of surface acoustic waves is minimized, and superior unidirectionality can be realized.

In preferred embodiments of the present invention, in the edge positions X1 to X4 of the first and second strips, which constitute basic sections and which have mutually different widths, when the center position of the basic section is 0(λ), and X1≅−X4, if the positions of X2 and X3 satisfy the equations (1) and (2), it is ensured that the absolute value of the vector angle of the reflection center is within approximately 45±10° or approximately 135±10° when the center of the basic section is the reference position, or that the absolute value of the phase difference between the excitation center and the reflection center is within approximately 45±10° or approximately 135±10°. It is, therefore, possible to easily and reliably provide, in accordance with preferred embodiments of the present invention, an asymmetrical double electrode which prevents the phase mismatching of surface acoustic waves, and which has a superior unidirectionality.

When the reflection amounts of surface acoustic waves at the edge positions X1 to X4 are substantially equal to one another, the phase mismatching between reflected surface acoustic waves and propagating surface acoustic waves is very effectively reduced.

When an IDT is constructed to include the asymmetrical double electrode, in accordance with various preferred embodiments of the present invention, the phase mismatching between reflected surface acoustic waves and propagating surface acoustic waves is prevented, thereby allowing an IDT having a superior unidirectionality to be provided, and enabling, for example, a low-loss transversal type surface acoustic wave device to be provided.

When the asymmetrical double electrode in accordance with preferred embodiments of the present invention is used as a reflector, since weighting can be easily performed with respect to the reflection coefficient, it is possible to provide a surface acoustic wave device which is capable of controlling the frequency characteristics of the overall reflection coefficient of reflectors.

While the present invention has been described with reference to what are at present considered to be preferred embodiments, it is to be understood that various changes and modifications may be made thereto without departing from the invention in its broader aspects and therefore, it is intended that the appended claims cover all such changes and modifications as fall within the true spirit and scope of the invention.

What is claimed is:

1. A surface acoustic wave device, comprising:

a piezoelectric substrate; and at least two basic sections disposed on said piezoelectric substrate, each of the at least two basic sections including an asymmetrical double electrode defining a half wavelength section and having first and second strips with different widths from each other;

wherein when edge positions of said first and second strips are X1, X2, X3 and X4, each of which is a value corrected using a sonic speed difference between a free surface and a metallic surface, and when a resultant vector length of normalized reflected waves from the edge positions is |Γ|, and a center position of one of said at least two basic sections is 0(λ), and X1≅−X4, each of the positions of X2 and X3 is substantially equal to a value satisfying the following equations (1) and (2):

$$X2[\lambda] = A \times X1[\lambda]^2 + B \times X1[\lambda] + C \pm 0.1[\lambda] \quad (1)$$

$$X3[\lambda] = D \times X1[\lambda]^2 + E \times X1[\lambda] + F \pm 0.05[\lambda] \quad (2);$$

wherein in the equation (1) and (2), A to F are expressed by the following equations:

$$A = -34.546 \times |\Gamma|^6 + 176.36 \times |\Gamma|^5 - 354.19 \times |\Gamma|^4 + 354.94 \times |\Gamma|^3 - 160.44 \times |\Gamma|^2 + 10.095 \times |\Gamma| - 1.7558$$

$$B = -15.464 \times |\Gamma|^6 + 77.741 \times |\Gamma|^5 - 153.44 \times |\Gamma|^4 + 147.20 \times |\Gamma|^3 - 68.363 \times |\Gamma|^2 + 6.3925 \times |\Gamma| - 1.7498$$

$$C = -1.772 \times |\Gamma|^6 + 8.7879 \times |\Gamma|^5 - 17.07 \times |\Gamma|^4 + 16.092 \times |\Gamma|^3 - 7.4655 \times |\Gamma|^2 + 0.8379 \times |\Gamma| - 0.3318$$

$$D = 12.064 \times |\Gamma|^6 - 45.501 \times |\Gamma|^5 + 57.344 \times |\Gamma|^4 - 22.683 \times |\Gamma|^3 + 12.933 \times |\Gamma|^2 - 15.938 \times |\Gamma| - 0.1815$$

$$E = 7.2106 \times |\Gamma|^6 - 30.023 \times |\Gamma|^5 + 45.792 \times |\Gamma|^4 - 29.784 \times |\Gamma|^3 + 13.125 \times |\Gamma|^2 - 6.3973 \times |\Gamma| + 1.0203$$

$$F = 1.0138 \times |\Gamma|^6 - 4.4422 \times |\Gamma|^5 + 7.3402 \times |\Gamma|^4 - 5.474 \times |\Gamma|^3 + 2.3366 \times |\Gamma|^2 - 0.7540 \times |\Gamma| + 0.2637.$$

2. A surface acoustic wave device according to claim 1, wherein the reflection amounts of surface acoustic waves at the edge positions X1, X2, X3 and X4 of said strips are substantially equal to one another.

3. A surface acoustic wave device according to claim 1, wherein said asymmetrical double electrode is an interdigital transducer.

4. A surface acoustic wave device according to claim 1, wherein said asymmetrical double electrode is a reflector.

5. A surface acoustic wave device according to claim 1, wherein said piezoelectric substrate is made of a quartz crystal material.

* * * * *

UNITED STATES PATENT AND TRADEMARK OFFICE
CERTIFICATE OF CORRECTION

PATENT NO. : 6,960,866 B2
DATED : November 1, 2005
INVENTOR(S) : Hajime Kando

It is certified that error appears in the above-identified patent and that said Letters Patent is hereby corrected as shown below:

Title page,
Item [56], References Cited, OTHER PUBLICATIONS, insert the following:
-- HANMA et al., "A Triple Transit Suppression Technique," IEEE Ultrasonic Symposium Proceedings, 1976, pp. 328-331.
TAKEUCHI et al., "Direct Numerical Analysis of SAW Coupling of Mode Equations and Its Application," 27th EM Symposium, pp. 109-116.
OHBUCHI et al., "Analysis of Excitation Characteristics of Interdigital SAW Transducers Using Coupling of Modes Theory," Institute of Electronics, Information and Communication Engineers of Japan, Technical Report MW90-62, pp. 69-74.
TAJIMA et al., "A Design Method for SAW Grating Reflectors," General Covention of Institute of Electronics, Information and Communication Engineers of Japan, 1999, p. 279. --.

Signed and Sealed this

Twenty-eighth Day of February, 2006

JON W. DUDAS
*Director of the United States Patent and Trademark Office*